(12) United States Patent
Wang et al.

(10) Patent No.: US 11,340,481 B2
(45) Date of Patent: May 24, 2022

(54) BACKLIGHT MODULE HAVING REFLECTIVE INDEX ADJUSTMENT MATERIAL, METHOD FOR PREPARING THE SAME, METHOD FOR DRIVING THE SAME, AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xinyu Wang, Beijing (CN); Wei Chen, Beijing (CN); Wencheng Luo, Beijing (CN); Jinhong Zhang, Beijing (CN); Meilong Hu, Beijing (CN); Guanglin Kang, Beijing (CN); Wenqi Quan, Beijing (CN); Shuai Hou, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/059,803

(22) PCT Filed: Apr. 26, 2020

(86) PCT No.: PCT/CN2020/086989
§ 371 (c)(1),
(2) Date: Nov. 30, 2020

(87) PCT Pub. No.: WO2020/228518
PCT Pub. Date: Nov. 19, 2020

(65) Prior Publication Data
US 2021/0231984 A1     Jul. 29, 2021

(30) Foreign Application Priority Data

May 16, 2019    (CN) .......................... 201910406612.3

(51) Int. Cl.
*G02F 1/095*     (2006.01)
*G09G 3/34*     (2006.01)

(52) U.S. Cl.
CPC ........... *G02F 1/095* (2013.01); *G09G 3/3486* (2013.01)

(58) Field of Classification Search
CPC ........ G02B 6/00; G02B 5/045; G02B 5/0215; G02B 6/005; G02B 5/003; G02F 1/095;
(Continued)

(56) References Cited

U.S. PATENT DOCUMENTS 6,398,370 B1 *   6/2002   Chiu ...................... G02B 5/003
                                                                                                                428/167
9,921,463 B2     3/2018   Tao et al.
(Continued)

FOREIGN PATENT DOCUMENTS

CN       101268387 A    9/2008
CN       101815965 A    8/2010
(Continued)

OTHER PUBLICATIONS

First Office Action for Chinese Application No. 201910406612.3, dated May 12, 2020, 9 Pages.
(Continued)

*Primary Examiner* — Richard J Hong
(74) *Attorney, Agent, or Firm* — Brooks Kushman P.C.

(57) ABSTRACT

The present disclosure provides a backlight module, a method for preparing the same, a driving method and a display device. The backlight module includes a backlight source and a light guide structure arranged on a light (Continued)

emitting surface of the backlight source; the backlight source includes a substrate and a plurality of light emitting units arranged on the substrate at intervals; the light guide structure includes a first medium layer and a second medium layer, the first medium layer includes a plurality of first medium structures corresponding to the plurality of light emitting units respectively, and an orthogonal projection of each light emitting unit on the substrate is located within an orthogonal projection of a corresponding first medium structure on the substrate; and the second medium layer includes a plurality of second medium structures, the plurality of second medium structures and the plurality of first medium structures are arranged alternately.

17 Claims, 4 Drawing Sheets

(58) Field of Classification Search
CPC ............ G02F 1/1336; G02F 1/133377; G02F 1/13476; G02F 1/133524; G02F 1/1323; G02F 1/134363; G09G 3/3406; G09G 3/3486
See application file for complete search history.

(56) References Cited

U.S. PATENT DOCUMENTS

| | | | |
|---|---|---|---|
| 10,139,550 B2 | 11/2018 | Thompson et al. | |
| 2005/0259198 A1* | 11/2005 | Lubart | G02F 1/133524 349/113 |
| 2008/0253132 A1 | 10/2008 | Urabe et al. | |
| 2009/0268128 A1 | 10/2009 | Yamada | |
| 2010/0214506 A1 | 8/2010 | Gaides et al. | |
| 2010/0245736 A1 | 9/2010 | Nishihara et al. | |
| 2010/0271721 A1* | 10/2010 | Gaides | G02B 5/045 359/885 |
| 2012/0281289 A1* | 11/2012 | Itoh | G02B 5/0215 359/599 |
| 2013/0141937 A1* | 6/2013 | Katsuta | G02B 6/005 362/606 |
| 2014/0117391 A1 | 5/2014 | Ha et al. | |
| 2014/0226093 A1* | 8/2014 | Schwartz | G02F 1/13476 349/12 |
| 2015/0009563 A1 | 1/2015 | Lauters et al. | |
| 2016/0011412 A1 | 1/2016 | Wang et al. | |
| 2016/0154259 A1* | 6/2016 | Kim | G02F 1/134363 349/33 |
| 2016/0357046 A1* | 12/2016 | Choi | G02F 1/1323 |
| 2017/0192139 A1 | 7/2017 | Wang et al. | |
| 2019/0171047 A1 | 6/2019 | Zhu | |
| 2020/0033678 A1 | 1/2020 | Lv et al. | |
| 2020/0166767 A1 | 5/2020 | Qin et al. | |
| 2020/0201088 A1* | 6/2020 | Yao | G02F 1/133377 |

FOREIGN PATENT DOCUMENTS

| | | |
|---|---|---|
| CN | 102749674 A | 10/2012 |
| CN | 104090377 A | 10/2014 |
| CN | 104375224 A | 2/2015 |
| CN | 105629354 A | 6/2016 |
| CN | 106405880 A | 2/2017 |
| CN | 205992103 U | 3/2017 |
| CN | 206134136 U | 4/2017 |
| CN | 106842710 A | 6/2017 |
| CN | 106970482 A | 7/2017 |
| CN | 107833556 A | 3/2018 |
| CN | 107884976 A | 4/2018 |
| CN | 207198511 U | 4/2018 |
| CN | 108075031 A | 5/2018 |
| CN | 109031784 A | 12/2018 |
| CN | 109270698 A | 1/2019 |
| CN | 110082854 A | 8/2019 |
| JP | 5472352 B2 | 4/2014 |

OTHER PUBLICATIONS

International Search Report and Written Opinion for Application No. PCT/CN2020/086989, dated Jul. 23, 2020, 10 Pages.

* cited by examiner

BACKLIGHT MODULE HAVING REFLECTIVE INDEX ADJUSTMENT MATERIAL, METHOD FOR PREPARING THE SAME, METHOD FOR DRIVING THE SAME, AND DISPLAY DEVICE

CROSS-REFERENCE TO RELATED APPLICATIONS

This application is the U.S. national phase of PCT Application No. PCT/CN2020/086989 filed on Apr. 26, 2020, which claims priority to Chinese Patent Application No. 201910406612.3 filed on May 16, 2019, which are incorporated herein by reference in their entireties.

TECHNICAL FIELD

The present disclosure relates to the field of display technology, in particular to a backlight module, a method for preparing the same, a method for driving the same, and a display device.

BACKGROUND

With the enhancement of people's security awareness, the requirements for the anti-peeping function of electronic display products are getting higher. However, the current display products with anti-peeping function can usually only realize the anti-peeping of the left and right directions of the display screen, and cannot realize the 360° anti-peeping function. Therefore, how to achieve 360° anti-peeping function of display products has become an urgent problem to be solved.

SUMMARY

A first aspect of the present disclosure provides a backlight module, including: a backlight source and a light guide structure arranged on the light emitting surface of the backlight source, in which the backlight source includes a substrate and a plurality of light emitting units arranged on the substrate at intervals;

the light guide structure includes a first medium layer and a second medium layer, the first medium layer includes a plurality of first medium structures corresponding to the plurality of light emitting units respectively, and an orthogonal projection of each light emitting unit on the substrate is located within an orthogonal projection of a corresponding first medium structure on the substrate; and the second medium layer includes a plurality of second medium structures, the plurality of second medium structure and the plurality of first medium structure are arranged alternately, and a refractive index of each second medium structure is less than a refractive index of a corresponding first medium structure.

In an example, a side surface of each of the plurality of first medium structures includes a first part and a second part that are connected, the second part is located on a surface of the first part away from the backlight source, a first slope angle formed between the first part and a plane where the substrate is located is less than a second slope angle formed between the second part and the plane where the substrate is located, and the first slope angle is equal to a light emitting angle of a corresponding light emitting unit; and an incident light having the light emitting angle is incident on an interface of the first medium structure and the second medium structure, the incident angle generated is greater than a critical angle of total reflection between the first medium structure and the second medium structure.

In an example, each first medium structure is made of a magnetic-induced refractive index adjustment material, each second medium structure is made of a blue filter material, and the backlight module further includes an electromagnetic unit for forming a controllable magnetic field, and the controllable magnetic field is configured to control the refractive index of the first medium structure.

In an example, the magnetic-induced refractive index adjustment material includes a transparent elastic carrier as well as a transparent magnetic material and a mesoporous silica that are distributed in the transparent elastic carrier.

In an example, the transparent magnetic material is selected from iron borate ($FeBO_3$), iron fluoride ($FeF_3$), $K_2CrCl_4$, europium selenide (EuSe), rare earth glass, and nano ferroferric oxide ($Fe_3O_4$); and the transparent elastic carrier is made of a material selected from polydimethylsiloxane, epoxy resin, polyurethane or silicone rubber.

In an example, the orthogonal projection of the first medium structure on the substrate is a regular hexagon.

In an example, the blue light filter material includes an ultraviolet absorber, titanium dioxide and silica gel.

In an example, the electromagnetic unit includes:

a control circuit arranged on the substrate for providing a control signal; and a plurality of electromagnetic subunits connected to the control circuit, the plurality of electromagnetic subunits being located in the peripheries of the plurality of light emitting units respectively, and the plurality of electromagnetic subunits being configured to generate a corresponding magnetic field under the control of the control signal.

Further, the plurality of electromagnetic subunits is arranged in an array on the substrate, and is located on the peripheries of the plurality of first medium structures respectively.

In an example, the substrate includes a flexible circuit board or a printed circuit board, and each light emitting unit includes a mini light-emitting diode.

In an example, an interval space is formed between adjacent first medium structures, the formed interval spaces correspond to the plurality of second medium structure, and the plurality of second medium structure fills in the interval space respectively.

A second aspect of the present disclosure provides a display device including the above-mentioned backlight module.

A third aspect of the present disclosure provides a method for preparing a backlight module, including:

preparing a plurality of light emitting units arranged on the substrate at intervals to form the backlight source in the backlight module;

preparing a light guide structure in the backlight module, the light guide structure including a first medium layer and a second medium layer, in which the first medium layer includes a plurality of first medium structures corresponding to the plurality of light emitting units respectively; and the second medium layer includes a plurality of second medium structures, the plurality of second medium structures and the plurality of first medium structures are arranged alternately, and a refractive index of each second medium structure is less than a refractive index of each first medium structure; and laminating the light guide structure on the light emitting surface of the plurality of light emitting units, in which an orthogonal projection of each light emitting unit on the substrate is located within an orthogonal projection of a corresponding first medium structure on the substrate.

In an example, the backlight module further includes an electromagnetic unit, and the preparing the light guide structure includes:

forming a mold for preparing the first medium structure;

preparing a mixed material of a transparent magnetic material, a mesoporous silica and a transparent elastic carrier, injecting the mixed material into the mold to form the first medium structure, and separating the first medium structure from the mold; and filling the blue filter material into the space formed between adjacent first medium structures to form the second medium structure; and the method further includes preparing an electromagnetic unit on the substrate, in which the electromagnetic unit is configured to form a controllable magnetic field, and the controllable magnetic field is configured to control the refractive index of the first medium structure.

In an example, the mold includes a plurality of accommodating spaces, in which an inner wall of each accommodating space includes a first part and a second part, and a slope angle of the first part is less than a slope angle of the second part.

A fourth aspect of the present disclosure provides a method for driving a backlight module, including:

emitting light by a light emitting unit in the backlight source in the backlight module; and allowing the light to be incident into the first medium structure in the light guide structure in the backlight module, and forming an incident angle on an interface between the first medium structure and the second medium structure in the light guide structure, in which the incident angle is greater than a critical angle of total reflection between the first medium structure and the second medium structure, so that the light directly leaves the light guide structure from the first medium structure.

In an example, the first medium structure is made of a magnetic-induced refractive index adjustment material, the second medium structure is made of a blue light filter material, and the backlight module further includes an electromagnetic unit, and the method further includes:

forming a controllable magnetic field by the electromagnetic unit, in which the controllable magnetic field controls a refractive index of the first medium structure, when the refractive index of the first medium structure is controlled to decrease, the light emitted by the light emitting unit is incident into the first medium structure, and an incident angle is formed on an interface between the first medium structure and the second medium structure, the incident angle is less than a critical angle of total reflection between the first medium structure and the second medium structure, such that the light is incident into the second medium structure, and leaves the light guide structure after being filtered by the second medium structure.

In an example, when the magnetic-induced refractive index adjustment material includes a transparent elastic carrier as well as a transparent magnetic material and a mesoporous silica that are distributed in the transparent elastic carrier, the electromagnetic unit forms a controllable magnetic field, and the controlling the refractive index of the first medium structure by the controllable magnetic field includes:

controlling the transparent magnetic material to gather or disperse in the transparent elastic carrier by the controllable magnetic field formed by the electromagnetic unit, so as to change the refractive index of the first medium structure.

In an example, when the electromagnetic unit includes a control circuit and a plurality of electromagnetic subunits, the controlling the transparent magnetic material to disperse in the transparent elastic carrier by the controllable magnetic field includes:

providing a same first control signal to the plurality of electromagnetic subunits by the control circuit; wherein under the control of the first control signal, a magnetic field generated by the plurality of electromagnetic subunits has a same polarity, and under the action of the same polarity magnetic field, the first medium structure controls the transparent magnetic material therein to gather toward a middle part of the first medium structure; or providing a same first control signal to the first part of the electromagnetic subunits in the plurality of electromagnetic subunits and providing a same second control signal to the second part of the electromagnetic subunits in the plurality of electromagnetic subunits by the control circuit, in which the first part of the electromagnetic subunits and the second part of the electromagnetic subunits are arranged alternately; the first part of the electromagnetic subunits generates a magnetic field with a first polarity under the control of the first control signal, the second part of the electromagnetic subunits generates a magnetic field with a second polarity under the control of the second control signal, and the first polarity is opposite to the second polarity; the first medium structure controls the transparent magnetic material therein to disperse towards an edge of the first medium structure under the action of a magnetic field with an opposite polarity.

BRIEF DESCRIPTION OF THE DRAWINGS

The drawings described herein are intended to provide a further understanding of the present disclosure, and constitutes a part of this disclosure. The illustrative embodiments of the present disclosure and the description thereof are intended to illustrate the present disclosure, and do not constitute an improper limitation of the present disclosure. In the drawings.

DETAILED DESCRIPTION

In order to further illustrate the backlight module, the method for preparing the same, the method for driving the same, and the display device provided by the embodiments of the present disclosure, the present disclosure will be described in detail hereinafter in conjunction with the drawings.

Figure 1:
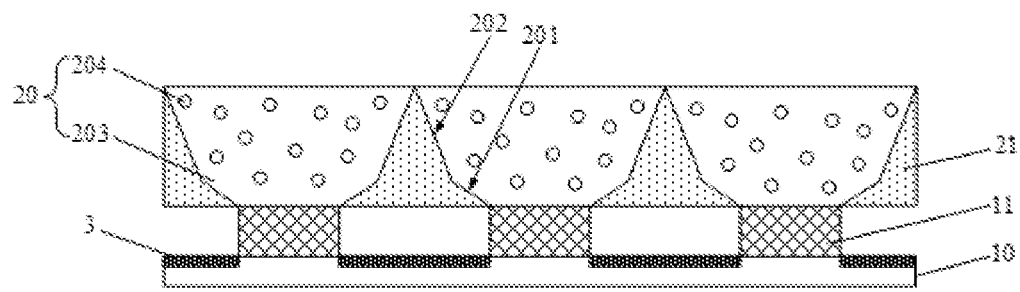
FIG. 1 is a schematic cross-sectional view showing a backlight module according to an embodiment of the disclosure.

Referring to FIG. 1, an embodiment of the present disclosure provides a backlight module, including: a backlight source and a light guide structure arranged on a light emitting surface of the backlight source, in which the backlight source includes a substrate 10 and a plurality of light emitting units 11 arranged on the substrate 10 at intervals.

The light guide structure includes: a first medium layer and a second medium layer; the first medium layer includes a plurality of first medium structures 20 corresponding to the plurality of light emitting units 11 in one-to-one manner, in which an orthogonal projection of the light emitting unit 11 on the substrate 10 is located within an orthogonal projection of the corresponding first medium structure 20 on the substrate 10; the second medium layer includes a plurality of second medium structures 21, the second medium structure 21 and the first medium structure 20 are alternately arranged, and a refractive index of the second medium structure 21 is less than a refractive index of the first medium structure 20.

Specifically, the plurality of light emitting units 11 included in the above-mentioned backlight source may be distributed in an array, and the specific type of the light emitting unit 11 may be set according to actual needs. The first medium layer in the above-mentioned light guide structure includes a plurality of first medium structures 20 corresponding to the plurality of light emitting units 11 in one-to-one manner; and the second medium layer includes a plurality of second medium structures 21, the first medium structures 20 and the second medium structures 21 are arranged alternately. Exemplarily, an interval space may be formed between adjacent first medium structures 20, the interval space formed corresponds to the second medium structure 21 in one-to-one manner, and the second medium structure 21 fills in the interval space in one-to-one manner. In more detail, the second medium structure 21 located in the interval space can be arranged to be in full contact with the first medium structure 20 for forming the interval space, that is, there is no gap between the second medium structure 21 located in the interval space and the first medium structures 20 for forming the interval space.

The orthogonal projection of the light emitting unit 11 on the substrate 10 is located within the corresponding orthogonal projection of the first medium structure 20 on the substrate 10, so that the light emitted from the light emitting unit 11 can be directly incident on the corresponding first medium structure 20, and then is emitted from the first medium structure 20 to the second medium structure 21, or directly leave the light guide structure from the first medium structure 20.

The materials of the first medium structure 20 and the second medium structure 21 can be selected according to actual needs, as long as the refractive index of the second medium structure 21 is less than the refractive index of the first medium structure 20. Thus, after the light emitted by the light emitting unit 11 is incident on the corresponding first medium structure 20, and when it is emitted from the first medium structure 20 to the second medium structure 21, if the incident angle formed at the interface of the first medium structure 20 and the second medium structure 21 is greater than the critical angle of total reflection between the first medium structure 20 and the second medium structure 21, the light can be totally reflected and finally leave the light guide structure from the first medium structure 20.

The actual working process of the above-mentioned backlight module is shown as follows.

The light emitting unit 11 in the backlight source emits light, and the light is directly incident on the first medium structure 20 corresponding to the light emitting unit 11. According to the difference in the angle of light incident into the first medium structure 20, after being incident into the first medium structure 20, a part of the light will be directly transmitted to the surface of the first medium structure 20 away from the light emitting unit 11, and leave the light guide structure from the surface. Another part of the light, after being incident into the first medium structure 20, will be incident on the interface between the first medium structure 20 and the second medium structure 21, and form a corresponding incident angle on the interface. Since the refractive index of a medium structure 20 is greater than the refractive index of the second medium structure 21, when the incident angle is greater than the critical angle of total reflection between the first medium structure 20 and the second medium structure 21, the light is totally reflected on the surface of the first medium structure 20 away from the light emitting unit 11, and leaves the light guide structure from the surface. When the incident angle is less than the critical angle of total reflection between the first medium structure 20 and the second medium structure 21, the light is directly incident into the second medium structure 21. After being incident into the second medium structure 21, it can leave the light guide structure from the second medium structure 21, or it is emitted from the second medium structure 21 to the first medium structure 20, and finally leave the light guide structure from the first medium structure 20.

According to the specific structure and actual working process of the backlight module described above, in the backlight module provided by the embodiments of the present disclosure, the light emitting unit 11 in the backlight source corresponds to the first medium structure 20 included in the first medium layer in the light guide structure in one-to-one manner, and the orthogonal projection of the light emitting unit 11 on the substrate 10 is located within the orthogonal projection of the corresponding first medium structure 20 on the substrate 10, so that the light emitted by the light emitting unit 11 can be directly incident on the corresponding first medium structure 20. Moreover, in the backlight module provided by the embodiment of the present disclosure, the first medium structure 20 included in the first medium layer in the light guide structure and the second medium structure 21 included in the second medium layer are arranged alternately, and the refractive index of the first medium structure 20 is greater than the refractive index of the second medium structure 21, so that when the light incident into the first medium structure 20 and the incident angle formed at the interface between the first medium structure 20 and the second medium structure 21 is greater than the critical angle of total reflection between the first medium structure 20 and the second medium structure 21, the light can be totally reflected, and finally leave the light guide structure from the first medium structure 20, thereby realizing that the light emitted from the light emitting unit 11 can only leave the light guide structure from the corresponding first medium structure 20, and effectively limiting the light emitting path of the light guide structure.

In view of this, in the backlight module provided by the embodiments of the present disclosure, the light emitted from the light guide structure can be controlled within a certain range of exit angles, so that when the user faces the light emitting surface of the light guide structure, the light emitted from the light guide structure can be seen only in the case that the user's eyes are within the exit angle range. If the user's eyes are outside the exit angle range, the light emitted by the light guide structure cannot be seen. Therefore, the backlight module provided by the embodiment of the present disclosure is applied to the display product, it can achieve 360° anti-peeping function of the display product, thereby further ensuring that the safety of the information displayed by the display product when the user uses the display product.

Continue to refer to FIG. 1, in the backlight module provided by the above embodiment, there are various specific structures of the first medium structure 20. Exemplarily, a side surface of the first medium structure 20 includes a first part 201 and a second part 202 that are connected to each other. The second part 202 is located on a surface of the first part 201 away from the backlight source, and the first slope angle formed between the first part 201 and the plane where the substrate 10 is located is less than the second slope angle formed between the second part 202 and the plane where the substrate 10 is located. The first slope angle is equal to the light emitting angle of the corresponding light emitting unit 11. When the incident light having the light emitting angle is incident on the interface between the first medium structure 20 and the second medium structure 21, the incident angle generated is greater than the critical angle of total reflection between the first medium structure 20 and the second medium structure 21.

Figure 2:
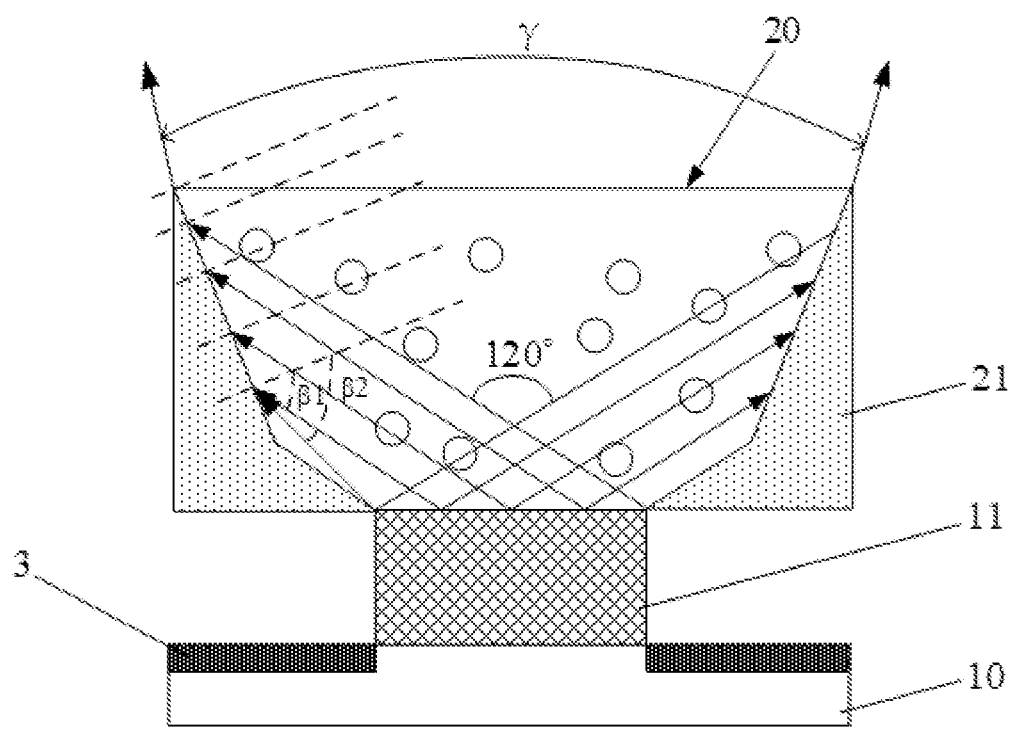
FIG. 2 is a schematic view showing the light emission of a first medium structure according to an embodiment of the disclosure.

Specifically, taking the light emitting unit 11 as an example of a mini light-emitting diode, the light emitting angle of the mini light-emitting diode is the scattering angle of the light emitted thereby. The scattering angle is mainly controlled by adding a scattering agent when the mini light-emitting diode is prepared. Exemplarily, as shown in FIG. 2, the light emitting unit 11 may be a mini light-emitting diode with a light emitting angle of 120°, but it is not limited to this.

If it is defined that the refractive index of the first medium structure 20 is n1 and the refractive index of the second medium structure 21 is n2, the critical angle θ1 of total reflection between the first medium structure 20 and the second medium structure 21 satisfies that θ1=arcsin(n2/n1). When the incident angle β1 generated by the incident light having the light emitting angle and incident on the interface between the first medium structure 20 and the second medium structure 21 is configured to be greater than the critical angle θ1 of total reflection between the first medium structure 20 and the second medium structure 21, that is, β1>θ1, total reflection can occur in the case that the incident light having the light emitting angle is incident on the interface between the first medium structure 20 and the second medium structure 21.

At the same time, the side surface of the first medium structure 20 is provided to include a first part 201 and a second part 202 that are connected to each other. The second part 202 is located on a surface of the first part 201 away from the backlight source, and the first slope angle corresponding to the first part 201 is less than the second slope angle corresponding to the two parts 202, such that the side surface of the first medium structure 20 is curved, and the first medium structure 20 is bowl-shaped. In this way, in the case that total reflection can occur when the incident light having the light emitting angle is incident on the interface between the first medium structure 20 and the second medium structure 21, and when the light emitted by the light emitting unit 11 at any angle is incident on the interface between the first medium structure 20 and the second medium structure 21, the incident angle generated β2 in FIG. 2) is greater than the critical angle θ1 of total reflection between the first medium structure 20 and the second medium structure 21, thereby realizing that the light emitted by the light emitting unit 11 at any angle can be totally reflected when it is incident on the interface between the first medium structure 20 and the second medium structure 21. Thus, the light emitted by the light emitting unit 11 is restricted in the first medium structure 20, so that the light exit angle can be limited within the target range when the light leaves the light guide structure, thereby achieving a 360° anti-peeping display.

Since the first medium structure 20 provided by the above-mentioned embodiment includes a first part 201 and a second part 202 that are connected to each other, the second part 202 is located on a surface of the first part 201 away from the backlight source, and the first slope angle formed between the first part 201 and the plane where the substrate 10 is located is less than the second slope angle formed between the second portion 202 and the plane where the substrate 10 is located, in which the first slope angle is equal to the light emitting angle of the corresponding light emitting unit 11, so that all the light emitted by the light emitting unit 11 can leave the light guide structure from the first medium structure 20. At the same time, by setting the first slope angle corresponding to the first portion 201, the second slope angle corresponding to the second portion 202 and the light emitting angle corresponding to light emitting unit 11, it is also possible to limit the exit angle of the light emitted from each first medium structure 20 to the light guide structure within the target range that meets the requirements (within the γ angle range in FIG. 2), so that when the user looks at the light guide structure from the light emitting surface of the light guide structure, the light emitted from the light guide structure can only be seen within the target range, thereby realizing a 360° anti-peeping display.

In addition, after the light emitted by the light emitting unit 11 is incident on the first medium structure 20 of the above-mentioned structure, a part of the light can be reflected in the first medium structure 20, and finally emitted from the surface of the first medium structure 20 away from the substrate 10, so that the first medium structure 20 can mix the light emitted by the light emitting unit 11. Thus, when the light emitted from the light emitting unit 11 leaves the light guide structure through the first medium structure 20, the emitted light has good uniformity and avoids adding an additional film layer for mixing light in the backlight module, thereby better reducing the thickness of the backlight module, and be conducive to the thin development of the backlight module.

In some embodiments, the first medium structure 20 is made of a magnetic-induced refractive index adjustment material, the second medium structure 21 is made of a blue filter material, and the backlight module further includes an electromagnetic unit for forming a controllable magnetic field, in which the controllable magnetic field is configured to control the refractive index of the first medium structure 20. When the refractive index of the first medium structure 20 is controlled to decrease, the incident angle of at least a part of the light emitted by the light-emitting unit 11 incident on the interface between the first medium structure 20 and the second medium structure 21 is less than the critical angle of total reflection between the first medium structure 20 and the second medium structure 21.

Specifically, the above-mentioned first medium structure 20 can be made of a magnetic-induced refractive index adjustment material, and the above-mentioned electromagnetic unit can form a magnetic field with controllable magnetic field strength and polarity, so that the refractive index of the first medium structure 20 can be controlled to become larger or smaller by controlling the intensity and polarity of the formed magnetic field.

Figure 3:
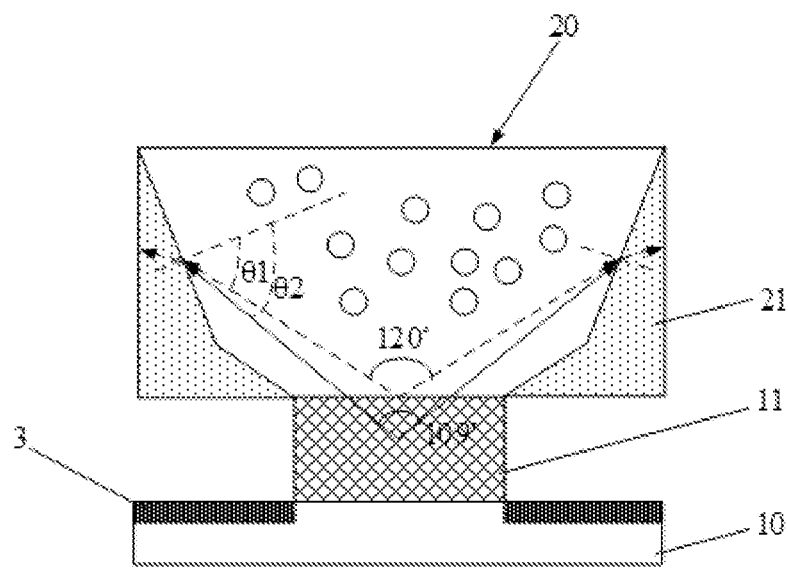
FIG. 3 is a schematic view showing a part of light incident on a second medium structure according to an embodiment of the disclosure.

In more detail, the electromagnetic unit forms a magnetic field with the target strength and polarity, and the magnetic field acts on the first medium structure 20 to reduce the refractive index of the first medium structure 20 to n1'. According to the total reflection law, the critical angle of total reflection between the first medium structure 20 and the second medium structure 21 is changed from θ1 to θ2, θ2=arcsin(n2/n1'). Since n1'<n1, θ2>θ1, so that when the light emitted by the light emitting unit 11 is incident on the interface between the first medium structure 20 and the second medium structure 21, at least a part of the light (for example, the light proximate to the edge of the light emitting angle of the light emitting unit 11, see the two light rays corresponding to 120° in FIG. 3) does not satisfy the total reflection law. It is incident from the first medium structure 20 to the second medium structure 21. Since the second medium structure 21 is made of blue filter material, after the light is incident from the first medium structure 20 to the second medium structure 21, at least a part of the blue light in the light can be filtered by the second medium structure 21, and then leaves the light guide structure from the second medium structure 21, or it is incident on the first medium structure 20 from the second medium structure 21, and then leaves the light guide structure from the first medium structure 20. In view of this, after the refractive index of the first medium structure 20 is reduced by the electromagnetic unit, a part of the light can be incident into the second medium structure 21, and filtered by the second medium structure 21 to leave the light guide structure, thereby enabling the backlight module to achieve an anti-blue light function.

Similarly, after the refractive index of the first medium structure 20 is controlled to n1' by the electromagnetic unit, the refractive index of the first medium structure 20 can also be changed from n1' to n1 by controlling the intensity and polarity of the magnetic field generated by the electromagnetic unit, thereby restoring the critical angle of total reflection between the first medium structure 20 and the second medium structure 21 to θ1=arcsin(n2/n1). Thus, total reflection can occur when the incident light emitted by the light emitting unit 11 is incident on the interface between the first medium structure 20 and the second medium structure 21, thereby enabling the backlight module to achieve a 360° anti-peeping function.

In the above arrangement, the first medium structure 20 is made of a magnetic-induced refractive index adjustment material, the second medium structure 21 is made of a blue filter material, and the backlight module also includes an electromagnetic unit for forming a controllable magnetic field, so that the controllable magnetic field generated by the electromagnetic unit can adjust the refractive index of the first medium structure 20 to switch between n1 and n1', thereby controlling the backlight module to switch in real time between 360° anti-peeping display and anti-blue light display, so that users can select corresponding functions according to actual needs in actual application.

In addition, the above-mentioned second medium structure 21 and the first medium structure 20 are alternately arranged on the substrate 10 to form a light guide structure together. Therefore, the second medium structure 21 is dispersed in the light guide structure without increasing the thickness of the backlight module, thereby being more conducive to the thinning of the backlight module.

It is worth noting that the specific types of the above-mentioned magnetic-induced refractive index adjustment materials can be selected according to actual needs. In some embodiments, the magnetic-induced refractive index adjustment material includes a transparent elastic carrier 203 as well as a transparent magnetic material 204 and a mesoporous silica distributed in the transparent elastic carrier 203.

Specifically, the working principle of the magnetic-induced refractive index adjustment material is shown as follows. Under the action of a controllable magnetic field, the transparent magnetic material 204 gathers or disperses in the transparent elastic carrier 203, so that the transparent elastic carrier 203 shrinks or stretches. As the transparent elastic carrier 203 shrinks or stretches, the density of the entire magnetic-induced refractive index adjustment material changes. As the density of the entire magnetic-induced refractive index adjustment material changes, the overall refractive index of the first medium structure 20 changes. In more detail, when the controllable magnetic field has an adsorption interaction on the transparent magnetic material 204, the transparent magnetic material 204 will gather in the transparent elastic carrier 203, thereby increasing the density of the overall magnetic-induced refractive index adjustment material, and further increasing the overall refractive index of the magnetic-induced refractive index adjustment material, so as to increase the refractive index of the first medium structure 20. When the controllable magnetic field has a repulsive interaction on the transparent magnetic material 204, the transparent magnetic material 204 will disperse in the transparent elastic carrier 203, thereby stretching the transparent elastic carrier 203, further reducing the overall density of the magnetic-induced refractive index adjustment material, and reducing the overall refractive index of the magnetic-induced refractive index adjustment material, so as to reduce the refractive index of the first medium structure 20.

It should be noted that the mesoporous silica in the magnetic-induced refractive index adjustment material mainly functions to reduce the refractive index of the magnetic-induced refractive index adjustment material in a stretched state.

Further, the transparent magnetic material 204 can be selected from iron borate ($FeBO_3$), iron fluoride ($FeF_3$), $K_2CrCl_4$, europium selenide (EuSe), rare earth glass, and nano ferroferric oxide ($Fe_3O_4$); and the transparent elastic carrier 203 is made of a material selected from polydimethylsiloxane, epoxy resin, polyurethane or silicone rubber, but not limited to this.

Figure 5:
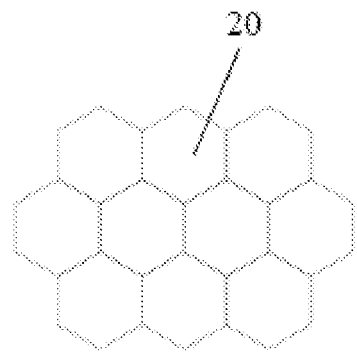
FIG. 5 is a schematic top view showing a first medium structure according to an embodiment of the disclosure.

As shown in FIG. 5, in some embodiments, the orthogonal projection of the first medium structure 20 on the substrate 10 may be configured to be a regular hexagon.

Specifically, the orthogonal projection of the first medium structure 20 on the substrate 10 is configured to be a regular hexagon. This not only enables the surface of each first medium structure 20 away from the substrate 10 to achieve seamless contact, but also enables each first medium structure 20 to emit light uniformly, thereby ensuring the uniformity of the brightness of the light emitted by the backlight module.

In some embodiments, the blue light filter material includes an ultraviolet absorber, titanium dioxide, and silica gel, which are used to filter a part of the blue light from the light incident on the second medium structure 21, in which the wavelength of the part of the blue light is less than or equal to 460 nm.

Figure 4:
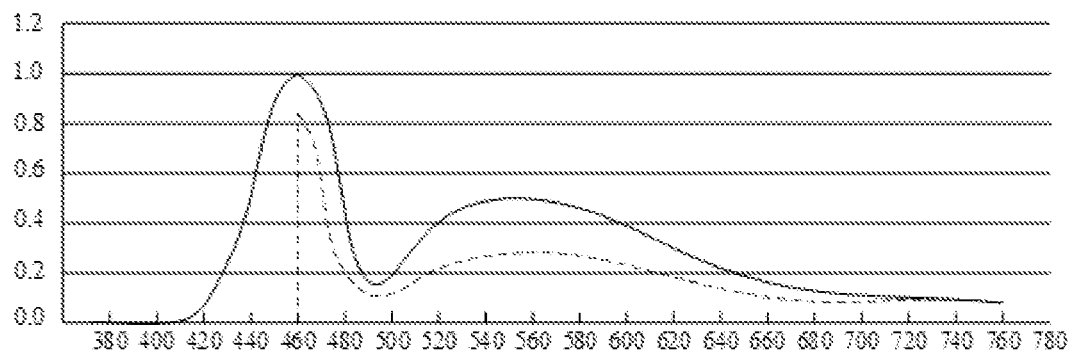
FIG. 4 is a schematic view showing the spectrum of light emitted by the light guide structure after filtering a part of blue light according to an embodiment of the disclosure.

Specifically, the light emitting unit may include a blue light chip, and the light emitting unit can emit white light. The blue filter material is configured to include the above-mentioned specific materials, so that the second medium structure 21 made of the blue light filter material can filter the blue light having a wavelength less than or equal to 460 nm in the light incident into the second medium structure 21, thereby effectively absorbing most of the blue light spectrum having a peak wavelength harmful to human eyes. At the same time, the second medium structure 21 made of the blue filter material can also effectively allow a spectrum having other peak wavelengths to pass through, so that the remaining long-wavelength blue light can still be mixed with the yellow light and red light excited thereby into white light having the desired color temperature, so as to meet actual display requirements. In view of this, when the second medium structure 21 is made of the above-mentioned blue light filter material, the light emitted through the second medium structure 21 not only reduces the harm of blue light, but also avoids the color shift phenomenon, thereby meeting the actual display requirements. Specifically, as shown in FIG. 4, the abscissa in FIG. 4 is the wavelength, in which the unit is nm; and the ordinate is the light intensity, in which the unit is candela. The solid line in FIG. 4 represents the spectrum of light emitted by the light guide structure before the filtering the blue light with a wavelength less than or equal to 460 nm; and the dotted line in FIG. 4 represents the spectrum of the light emitted by the light guide structure after the filtering the blue light with a wavelength less than or equal to 460 nm.

Continuing to refer to FIG. 1, in some embodiments, the electromagnetic unit provided in the above-mentioned embodiments includes:

a control circuit arranged on the substrate 10 for providing a control signal; and a plurality of electromagnetic subunits 3 respectively connected to the control circuit, the plurality of electromagnetic subunits 3 being located in the peripheries of the light emitting unit 11 in one-to-one correspondence, and the electromagnetic subunits 3 being configured to generate a corresponding magnetic field under the control of the control signal.

Specifically, the above-mentioned electromagnetic unit may include a control circuit and a plurality of electromagnetic subunits 3 respectively connected to the control circuit, in which the control circuit can be optionally a microcircuit, and be arranged on the edge area of the substrate 10. The arrangement of the control circuit and the plurality of electromagnetic subunits 3 on the substrate 10 not only has a simple setting method and strong applicability, but also the integration of the electromagnetic unit on the substrate 10 of the backlight source will not increase the thickness of the backlight module because the light emitting unit 11 arranged on the substrate 10 in the backlight source has a certain height.

The control circuit can output a control signal, in which the control signal can be a current signal. The magnitude and polarity of the magnetic field generated by the electromagnetic subunit 3 can be controlled by controlling the magnitude of the current signal, thereby changing the refractive index of the magnetic-induced refractive index adjustment material. Exemplarily, when the current intensity of the current signal changes in the range of 50 mA to 500 mA, the refractive index of the magnetic-induced refractive index adjustment material changes in the range of 1.19 to 1.9.

It is worth noting that a plurality of electromagnetic subunits 3 may be distributed on the substrate 10 in an array, and each electromagnetic subunit 3 is located at the periphery of its corresponding light emitting unit 11. Since the light emitting unit 11 corresponds to the first medium structure 20 in one-to-one manner, and the orthogonal projection of the light emitting unit 11 on the substrate 10 is located within the orthogonal projection of the corresponding first medium structure 20 on the substrate 10, each electromagnetic subunit 3 is also located at the periphery of the first medium structure 20 in a one-to-one correspondence. Since a plurality of electromagnetic subunits 3 are distributed on the substrate 10 in an array, each first medium structure 20 under the combined action of the magnetic field generated by at least two electromagnetic subunits 3 adjacent thereto can change its refractive index.

In some embodiments, the substrate 10 of the backlight source provided in the above-mentioned embodiments may include a flexible circuit board or a printed circuit board, and the light emitting unit 11 of the backlight source may include mini light-emitting diodes.

Specifically, when the substrate 10 is made of a flexible circuit board or a printed circuit board, the control circuit and the electromagnetic subunit 3 can be arranged on the surface of the flexible circuit board or the printed circuit board, or the control circuit and the electromagnetic subunit 3 can be embedded in a flexible circuit board or a printed circuit board. The above-mentioned mini light-emitting diodes may include mini LEDs or micro LEDs, but are not limited thereto.

An embodiment of the present disclosure further provides a display device including the backlight module provided by the above embodiment.

Since in the backlight module provided by the above embodiments, the light emitted from the light guide structure can be controlled within a certain range of exit angles, so that when the user faces the light emitting surface of the light guide structure, the light emitted from the light guide structure can be seen only in the case that the user's eyes are within the exit angle range. If the user's eyes are outside the exit angle range, the light emitted by the light guide structure cannot be seen. Therefore, when the display device provided in the embodiments of the present disclosure includes the backlight module provided by the above-mentioned embodiments, it can achieve 360° anti-peeping function, thereby ensuring the safety of the information displayed by the display device when the user uses the display device.

In addition, since the above-mentioned backlight module also has the beneficial effects of being able to realize the real-time switching between 360° anti-peeping display and anti-blue light display, satisfying the development needs of thinning, and having high brightness uniformity of the light emitted, when the backlight module provided by the above-mentioned embodiment is included, it also has the above-mentioned beneficial effects, which will not be repeated herein.

It should be noted that the display device may include any product or component having a display function, such as a television, a display, a digital photo frame, a mobile phone, and a tablet computer.

The embodiment of the present disclosure further provides a method for preparing a backlight module, which is used for preparing the backlight module provided by the above embodiments, and the method includes:

preparing a plurality of light emitting units 11 arranged on the provided substrate 10 at intervals to form a backlight source in the backlight module;

preparing a light guide structure in the backlight module, in which the light guide structure includes a first medium layer and a second medium layer, the first medium layer includes a plurality of first medium structures 20 corresponding to the plurality of light emitting units 11 in one-to-one manner; and the second medium layer includes a plurality of second medium structures 21, the second medium structure 21 and the first medium structure 20 are arranged alternately, and a refractive index of the second medium structure 21 is less than a refractive index of the first medium structure 20; and laminating the light guide structure on the light emitting surface of the plurality of light emitting units 11, in which an orthogonal projection of the light emitting unit 11 on the substrate 10 is located within a corresponding orthogonal projection of the first medium structure 20 on the substrate 10.

Specifically, when the backlight source is prepared, the selected substrate 10 includes a flexible circuit board or a printed circuit board, and the light emitting unit 11 prepared on the substrate 10 includes a mini light-emitting diode (mini LED or micro LED).

When the light guide structure is prepared, a first medium layer can be prepared first, in which the first medium layer includes a plurality of first medium structures 20 and an interval space is formed between adjacent first medium structures 20; and then a plurality of second medium structures 21 are formed in the plurality of interval spaces formed by the first medium structure 20, in which the plurality of second medium structures 21 constitutes a second medium layer.

After the light guide structure is prepared, the light guide structure is laminated on the light emitting surface of the light emitting unit 11 in the backlight source, and the orthogonal projection of the light emitting unit 11 on the substrate 10 is located within the corresponding orthogonal projection of the first medium structure 20 on the substrate 10, so that the light emitted from the light emitting unit 11 can be directly incident on the corresponding first medium structure 20, and then emits from the first medium structure 20 to the second medium structure 21, or directly leaves the light guide structure from the first medium structure 20.

It is worth noting that the materials of the first medium structure 20 and the second medium structure 21 can be selected according to actual needs, as long as the refractive index of the second medium structure 21 is less than the refractive index of the first medium structure 20. Thus, after the light emitted by the light emitting unit 11 is incident on the corresponding first medium structure 20, and when it is emitted from the first medium structure 20 to the second medium structure 21, if the incident angle formed at the interface of the first medium structure 20 and the second medium structure 21 is greater than the critical angle of total reflection between the first medium structure 20 and the second medium structure 21, the light can be totally reflected and finally leaves the light guide structure from the first medium structure 20.

In the backlight module prepared by the preparation method provided by the embodiment of the present disclosure, the light emitting unit 11 in the backlight source corresponds to the first medium structure 20 included in the first medium layer in the light guide structure in one-to-one manner, and the orthogonal projection of the light emitting unit 11 on the substrate 10 is located within the orthogonal projection of the corresponding first medium structure 20 on the substrate 10, so that the light emitted by the light emitting unit 11 can be directly incident on the corresponding first medium structure 20. Moreover, in the backlight module prepared by the preparation method provided by the embodiment of the present disclosure, the first medium structure 20 included in the first medium layer in the light guide structure and the second medium structure 21 included in the second medium layer are arranged alternately, and the refractive index of the structure 20 is greater than the refractive index of the second medium structure 21, so that when the light incident into the first medium structure 20 and the incident angle formed at the interface between the first medium structure 20 and the second medium structure 21 is greater than the critical angle of total reflection between the first medium structure 20 and the second medium structure 21, the light can be totally reflected, and finally leaves the light guide structure from the first medium structure 20, thereby realizing that the light emitted from the light emitting unit 11 can only leave the light guide structure from the corresponding first medium structure 20, and effectively limiting the light emitting path of the light guide structure.

In view of this, in the backlight module prepared by the preparation method provided by the embodiments of the present disclosure, the light emitted from the light guide structure can be controlled within a certain range of exit angles, so that when the user faces the light emitting surface of the light guide structure, the light emitted from the light guide structure can be seen only in the case that the user's eyes are within the exit angle range. If the user's eyes are outside the exit angle range, the light emitted by the light guide structure cannot be seen. Therefore, when the backlight module prepared by the preparation method provided by the embodiments of the present disclosure is applied into a display product, it can achieve 360° anti-peeping function of the display product, thereby ensuring the safety of the information displayed by the display product when the user uses the display product.

Figure 6:
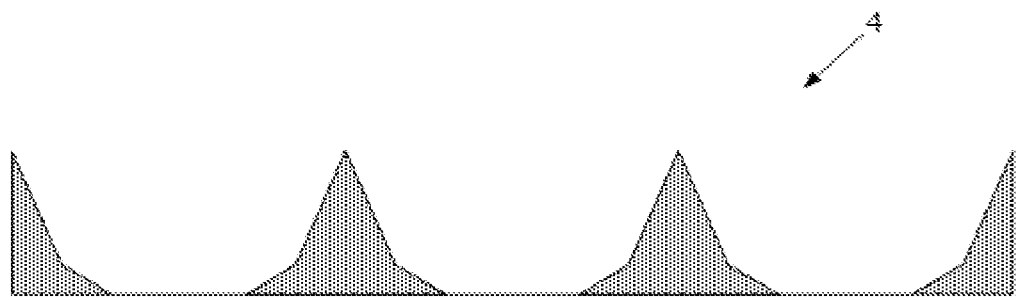
FIG. 6 is a schematic view showing a mold for preparing a first medium structure according to an embodiment of the disclosure.
Figure 7:
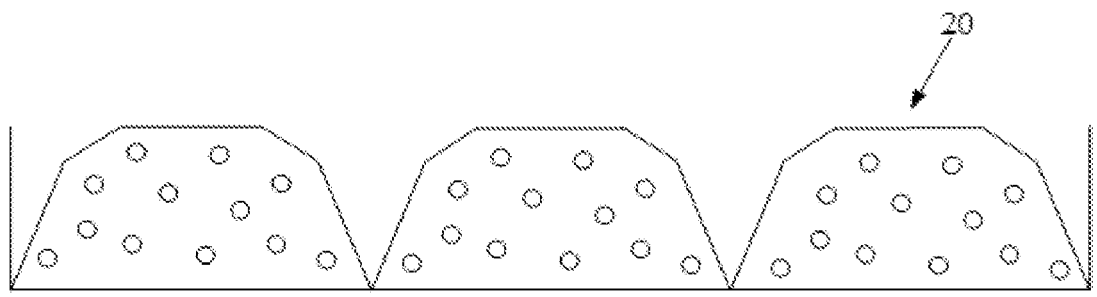
FIG. 7 is a schematic cross-sectional view showing a first medium structure according to an embodiment of the disclosure.
Figure 8:
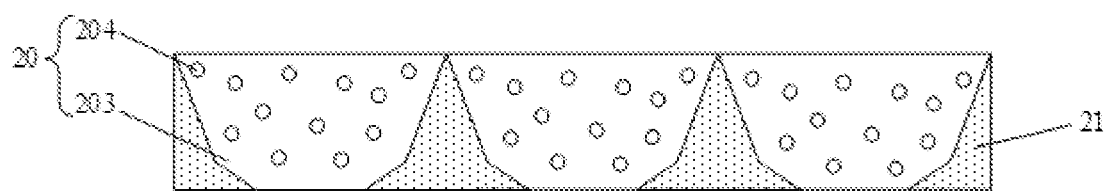
FIG. 8 is a schematic cross-sectional view showing a light guide structure according to an embodiment of the disclosure.

As shown in FIGS. 6 to 8, in some embodiments, when the backlight module further includes an electromagnetic unit, the preparing the light guide structure specifically includes:

forming a mold 4 for preparing the first medium structure 20;

preparing a mixed material of a transparent magnetic material 204, a mesoporous silica and a transparent elastic carrier 203, injecting the mixed material into the mold 4 to form the first medium structure 20, and separating the first medium structure 20 from the mold 4; and filling the blue filter material into the space formed between the adjacent first medium structures 20 to form the second medium structure 21.

The method for preparing the backlight module further includes: preparing an electromagnetic unit on the substrate 10, and the electromagnetic unit is used to form a controllable magnetic field, in which the controllable magnetic field is configured to control the refractive index of the first medium structure 20. When the refractive index of the first medium structure 20 is controlled to decrease, the incident angle of the light emitted by the light-emitting unit 11 incident on the interface between the first medium structure 20 and the second medium structure 21 is less than the critical angle of total reflection between the first medium structure 20 and the second medium structure 21.

Specifically, the above-mentioned first medium layer and the second medium layer can both be prepared by an injection molding process. Exemplarily, a mold 4 for preparing the first medium structure 20 can be prepared first, in which the mold 4 includes a plurality of accommodating spaces. The inner wall of each accommodating space may include a first part and a second part, in which the slope angle of the first part is less than the slope angle of the second part, so that each accommodating space is formed into a bowl-shaped structure. The mixed material of the prepared transparent magnetic material 204, mesoporous silica, and transparent elastic carrier is injected in to each accommodating space of the mold 4, and then the mixed material injected into each accommodating space is cured, thereby forming a corresponding first medium structure 20 in each accommodating space, in which a plurality of first medium structures 20 constitutes a first medium layer. It is worth noting that the first part in the side surface of the formed first medium structure 20 corresponds to the first part in the inner wall of the corresponding accommodating space, and the second part in the side surface of the formed first medium structure 20 corresponds to the second part in the inner wall of the corresponding accommodating space.

Then the first medium layer is demolded, and in the first medium layer, the opening of the interval space formed in the adjacent first medium structure 20 faces upward; then the blue filter material for forming the second medium structure 21 is injected into the interval space formed between the adjacent first medium structures 20, and then the blue light filter material is cured to form the second medium structure 21.

It is worth noting that in the first medium layer and the second medium layer prepared by the above-mentioned preparation method, the adjacent first medium structure 20 and the second medium structure 21 can be in complete contact, that is, there is no gap, so that the light output angle of the prepared backlight module is easier to be controlled.

In addition, when the backlight source is prepared, an electromagnetic unit can be prepared on the substrate 10 of the backlight source, and the electromagnetic unit is used to form a controllable magnetic field. In more detail, the electromagnetic unit includes a control circuit and an electromagnetic subunit 3, in which the control circuit can be prepared at the edge area of the substrate 10, and the electromagnetic subunit 3 can be prepared at the periphery of the light emitting unit 11 in a one-to-one correspondence; moreover, the electromagnetic subunit 3 can be prepared on the surface of the substrate 10 or embedded in the substrate 10.

In the backlight module prepared by the preparation method provided in the above embodiment, the refractive index of the first medium structure 20 can be adjusted by the controllable magnetic field generated by the electromagnetic unit, so that the backlight module can be controlled to achieve a real-time switching between 360° anti-peeping display and anti-blue light display, thus the user can select corresponding functions according to actual needs in actual applications. In addition, in the backlight module prepared by the preparation method provided in the above embodiments, the second medium structure 21 and the first medium structure 20 are alternately arranged on the substrate 10 to form a light guide structure together. Thus, the second medium structure 21 is dispersed in the light guide structure, and the thickness of the backlight module is not increased, thereby being more conducive to the thinning of the backlight module.

The embodiment of the present disclosure further provides a method for driving a backlight module, which is used for driving the backlight module provided by the above embodiments, and the method includes:

emitting light by a light emitting unit 11 included in the backlight source in the backlight module; and allowing light to be incident into the first medium structure 20 included in the light guide structure in the backlight module, and forming an incident angle on an interface between the first medium structure 20 and the second medium structure 21 in the light guide structure, in which an incident angle is greater than a critical angle of total reflection between the first medium structure 20 and the second medium structure 21, so that the light directly leaves the light guide structure from the first medium structure 20.

Specifically, the light emitting unit 11 in the backlight source emits light, and the light is directly incident into the first medium structure 20 corresponding to the light emitting unit 11. According to the difference in the angle of light incident into the first medium structure 20, after being incident into the first medium structure 20, a part of the light will be directly transmitted to the surface of the first medium structure 20 away from the light emitting unit 11, and leaves the light guide structure from the surface. After being incident into the first medium structure 20, another part of the light will be incident on the interface between the first medium structure 20 and the second medium structure 21, and form a corresponding incident angle on the interface. Since the refractive index of the medium structure 20 is greater than the refractive index of the second medium structure 21, when the incident angle is greater than the critical angle of total reflection between the first medium structure 20 and the second medium structure 21, the light is totally reflected on the surface of the first medium structure 20 away from the light emitting unit 11, and leaves the light guide structure from the surface. When the incident angle is less than the critical angle of total reflection between the first medium structure 20 and the second medium structure 21, the light is directly incident into the second medium structure 21. After being incident into the second medium structure 21, it can leave the light guide structure from the second medium structure 21, or emits from the second medium structure 21 to the first medium structure 20, and finally leave the light guide structure from the first medium structure 20.

When the driving method provided by the embodiments of the present disclosure is used to drive the backlight module provided by the above embodiments, the light emitted by the light emitting unit 11 can be directly incident into the corresponding first medium structure 20; when the incident angle formed by the light incident into the first medium structure 20 which is incident on the interface between the first medium structure 20 and the second medium structure 21 is greater than the critical angle of total reflection between the first medium structure 20 and the second medium structure 21, the light can be totally reflected, and finally leaves the light guide structure from the first medium structure 20, thereby realizing that the light emitted from the light emitting unit 11 can only leave the light guide structure from the corresponding first medium structure 20, and effectively limiting the light emitting path of the light guide structure.

In view of this, when the backlight module prepared by the above embodiments is driven by the driving method provided by the embodiments of the present disclosure, the light emitted from the light guide structure can be controlled within a certain range of exit angles, so that when the user faces the light emitting surface of the light guide structure, the light emitted from the light guide structure can be seen only in the case that the user's eyes are within the exit angle range. If the user's eyes are outside the exit angle range, the light emitted by the light guide structure cannot be seen. Therefore, when the backlight module prepared by the above embodiments is driven by the driving method provided by the embodiments of the present disclosure, the backlight module can achieve 360° anti-peep function, so that when the backlight module is applied to display products, it can be better ensure the security of the information displayed by the display product.

In some embodiments, when the first medium structure 20 is made of a magnetic-induced refractive index adjustment material, and the second medium structure 21 is made of a blue filter material, the backlight module further includes: forming a controllable magnetic field by the electromagnetic unit, in which the controllable magnetic field controls a refractive index of the first medium structure 20, when the refractive index of the first medium structure 20 is controlled to decrease, the light emitted by the light emitting unit 11 is incident into the first medium structure 20, and an incident angle on an interface between the first medium structure 20 and the second medium structure 21 is formed, the incident angle is less than a critical angle of total reflection between the first medium structure 20 and the second medium structure 21, such that the light is incident into the second medium structure 21, and leaves the light guide structure after being filtered by the second medium structure 21.

Specifically, the first medium structure 20 can be made of a magnetic-induced refractive index adjustment material, and the above-mentioned electromagnetic unit can form a magnetic field with controllable strength and polarity of the magnetic field. In this way, the refractive index of the first medium structure 20 is controlled to become larger or smaller by controlling the strength and polarity of the formed magnetic field.

In more detail, the original refractive index of the first medium structure 20 is n1 and the refractive index of the second medium structure 21 is n2, the critical angle θ1 of total reflection between the first medium structure 20 and the second medium structure 21 satisfies that θ1=arcsin(n2/n1). When the incident angle β1 generated by the incident light having the light emitting angle and incident on the interface between the first medium structure 20 and the second medium structure 21 is configured to be greater than the critical angle θ1 of total reflection between the first medium structure 20 and the second medium structure 21, that is, β1>θ1, total reflection can occur in the case that the incident light having the light emitting angle is incident on the interface between the first medium structure 20 and the second medium structure 21.

The electromagnetic unit is controlled to form a magnetic field with the target strength and polarity, and the magnetic field acts on the first medium structure 20 to reduce the refractive index of the first medium structure 20 to n1'. According to the total reflection law, the critical angle of total reflection between the first medium structure 20 and the two medium structures 21 is changed from θ1 to θ2, θ2=arcsin(n2/n1'). Since n1'<n1, θ2>θ1, so that when the light emitted by the light emitting unit 11 is incident on the interface between the first medium structure 20 and the second medium structure 21, at least a part of the light (for example, the light proximate to the edge of the light emitting angle of the light emitting unit 11, see the two light rays corresponding to 120° in FIG. 3) does not satisfy the total reflection law. It is incident from the first medium structure 20 to the second medium structure 21. Since the second medium structure 21 is made of blue filter material, after the light is incident from the first medium structure 20 to the second medium structure 21, at least a part of the blue light in the light can be filtered by the second medium structure 21, and then leaves the light guide structure from the second medium structure 21, or leaves the second medium structure 21 and incident on the first medium structure 20, and then leaves the light guide structure from the first medium structure 20.

Similarly, after the refractive index of the first medium structure 20 is changed to n1' by the electromagnetic unit, the refractive index of the first medium structure 20 can also be changed from n1' to n1 by controlling the intensity and polarity of the magnetic field generated by the electromagnetic unit, thereby restoring the critical angle of total reflection between the first medium structure 20 and the second medium structure 21 to θ1=arcsin(n2/n1). Thus, the incident light emitted by the light emitting unit 11 is incident on the interface between the first medium structure 20 and the second medium structure 21.

When the backlight module provided in the above embodiment is driven by the driving method provided in the above embodiment, the refractive index of the first medium structure 20 can be adjusted to switch between n1 and n1' through the controllable magnetic field generated by the electromagnetic unit, thereby controlling the backlight module to achieve the real-time switching between 360° anti-peeping display and anti-blue light display, so that users can select corresponding functions according to actual needs in actual applications.

In some embodiments, when the magnetic-induced refractive index adjustment material includes a transparent elastic carrier 203 as well as a transparent magnetic material 204 and a mesoporous silica distributed in the transparent elastic carrier 203, the electromagnetic unit forms a controllable magnetic field, and the controlling the refractive index of the first medium structure 20 by the controllable magnetic field includes:

controlling the transparent magnetic material to gather or disperse in the transparent elastic carrier 203 by the controllable magnetic field formed by the electromagnetic unit 204, so as to change the refractive index of the first medium structure 20.

Specifically, under the action of a controllable magnetic field, the transparent magnetic material 204 gathers or disperses in the transparent elastic carrier 203, so that the transparent elastic carrier 203 shrinks or stretches. As the transparent elastic carrier 203 shrinks or stretches, the density of the entire magnetic-induced refractive index adjustment material changes. As the density of the entire magnetic-induced refractive index adjustment material changes, the overall refractive index of the first medium structure 20 changes. In more detail, when the controllable magnetic field has an adsorption interaction on the transparent magnetic material 204, the transparent magnetic material 204 will gather in the transparent elastic carrier 203, thereby increasing the density of the overall magnetic-induced refractive index adjustment material, and further increasing the overall refractive index of the magnetic-induced refractive index adjustment material, so as to increase the refractive index of the first medium structure 20. When the controllable magnetic field has a repulsive interaction on the transparent magnetic material 204, the transparent magnetic material 204 will disperse in the transparent elastic carrier 203, thereby stretching the transparent elastic carrier 203, further reducing the overall density of the magnetic-induced refractive index adjustment material, and reducing the overall refractive index of the magnetic-induced refractive index adjustment material, so as to reduce the refractive index of the first medium structure 20.

Figure 9:
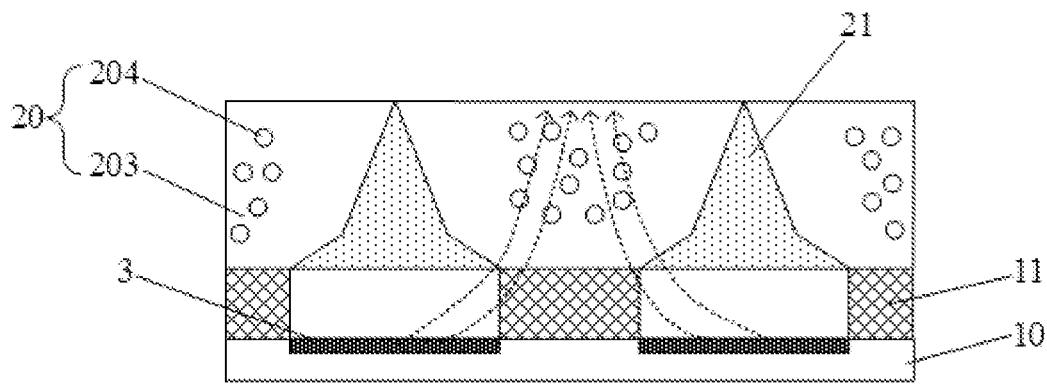
FIG. 9 is a schematic view showing the controlling the gathering of a transparent magnetic material according to an embodiment of the disclosure.
Figure 10:
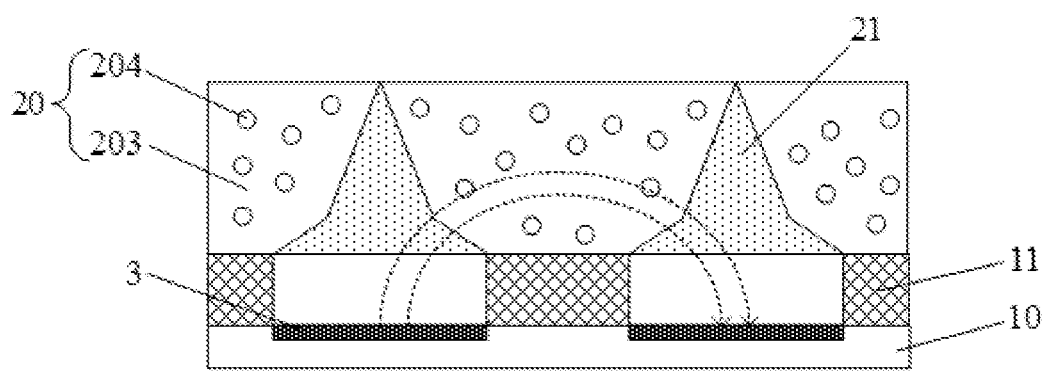
FIG. 10 is a schematic view showing controlling the dispersion of a transparent magnetic material according to an embodiment of the disclosure.

Further, when the electromagnetic unit includes a control circuit and a plurality of electromagnetic subunits 3, the controlling the transparent magnetic material 204 to gather or disperse in the transparent elastic carrier 203 by the controllable magnetic field specifically includes:

as shown in FIG. 9, providing a same first control signal to the plurality of electromagnetic subunits 3 by the control circuit; under the control of the first control signal, a magnetic field generated by the plurality of electromagnetic subunits 3 has a same polarity, and under the action of the same polarity magnetic field, the first medium structure 20 controls the transparent magnetic material 204 therein to gather toward a middle part of the first medium structure 20; or as shown in FIG. 10, providing the same first control signal to the first part of the electromagnetic subunits 3 in the plurality of electromagnetic subunits 3 and providing the same second control signal to the second part of the electromagnetic subunits 3 in the plurality of electromagnetic subunits 3 by the control circuit, in which the first part of the electromagnetic subunits 3 and the second part of the electromagnetic subunits 3 are arranged alternately; the first part of the electromagnetic subunits 3 generate a magnetic field with a first polarity under the control of the first control signal, the second part of the electromagnetic subunits 3 generate a magnetic field with a second polarity under the control of the second control signal, and the first polarity is opposite to the second polarity; the first medium structure 20 controls the transparent magnetic material 204 therein to disperse towards an edge of the first medium structure 20 under the action of a magnetic field with an opposite polarity.

Specifically, in the backlight module provided by the above-mentioned embodiment, a plurality of light emitting units 11 included in the backlight source are distributed in an array, and a plurality of electromagnetic subunits 3 is provided at the periphery of each light emitting unit 11, that is, the plurality of electromagnetic subunits 3 included in the electromagnetic unit in the backlight module are also distributed on the substrate 10 in an array. Exemplarily, it may be provided that a corresponding electromagnetic subunit 3 is provided on the left side of each light emitting unit 11, so that each first medium structure 20 can change the refractive index under the combined action of the magnetic fields generated by at least two adjacent electromagnetic subunits 3.

In more detail, when the controllable magnetic field controls the transparent magnetic material 204 to gather in the transparent elastic carrier 203, the specific control process is shown as follows.

As shown in FIG. 9, the control circuit provides the same first control signal to the plurality of electromagnetic subunits 3, in which the first control signal may be a current signal. Under the control of the current signal, the magnetic fields generated by the plurality of electromagnetic subunits 3 have the same polarity, so that the magnetic fields generated by the adjacent electromagnetic subunits 3 repel each other (the dotted line with arrows in FIG. 9 represents the line of magnetic force). The first medium structure 20, under the control of the same polar magnetic field located proximate thereto, allows the transparent magnetic material 204 therein to move to the middle area of the first medium structure 20, further causing a large amount of transparent magnetic material 204 to gather in the middle of the first medium structure, resulting in a decrease in the refractive index of the edge part proximate to the first medium structure 20 and the second medium structure 21, so that a part of the light can be incident from the first medium structure 20 into the second medium structure 21 to realize the anti-blue light function.

When the controllable magnetic field controls the transparent magnetic material 204 to disperse in the transparent elastic carrier 203, the specific control process is shown as follows.

The control circuit provides the same first control signal to the first part of the electromagnetic subunits 3 of the plurality of electromagnetic subunits 3, so that the first part of the electromagnetic subunits 3 generates a magnetic field with the first polarity. The second part of the electromagnetic subunits 3 of the plurality of electromagnetic subunits 3 provides the same second control signal, so that the second part of the electromagnetic subunits 3 generates a magnetic field with a second polarity, in which the first polarity and the second polarity are opposite. Since the first part of the electromagnetic subunits 3 and the second part of the electromagnetic subunits 3 are alternately arranged, the magnetic fields generated by the adjacent electromagnetic subunits 3 attract each other (the dotted lines with arrows in FIG. 10 represents the lines of magnetic force). The first medium structure 20, under the control of different polar magnetic field located proximate thereto, allows the transparent magnetic material 204 therein to disperse toward the edge of the first medium structure 20, resulting in an increase in the refractive index of the edge part proximate to the first medium structure 20 and the second medium structure 21, so that when the light in the first medium structure 20 is incident on the interface between the first medium structure 20 and the second medium structure 21, it will be total reflected to achieve 360° anti-peeping function.

In the technical solution provided by the present disclosure, the light emitting unit in the backlight source corresponds to the first medium structure included in the first medium layer in the light guide structure in one-to-one manner, and the orthogonal projection of the light emitting unit on the substrate is located within the orthogonal projection of the corresponding first medium structure on the substrate, so that the light emitted by the light emitting unit can be directly incident on the corresponding first medium structure. Moreover, in the technical solution provided by the present disclosure, the first medium structure included in the first medium layer in the light guide structure and the second medium structure included in the second medium layer are arranged alternately, and the refractive index of the structure is greater than the refractive index of the second medium structure, so that when the incident angle formed at the interface between the first medium structure and the second medium structure is greater than the critical angle of total reflection between the first medium structure and the second medium structure, the light incident into the first medium structure can be totally reflected, and finally leave the light guide structure from the first medium structure, thereby realizing that the light emitted from the light emitting unit can only leave the light guide structure from the corresponding first medium structure, and effectively limiting the light emitting path of the light guide structure.

In view of this, in the technical solution provided by the present disclosure, the light emitted from the light guide structure can be controlled within a certain range of exit angles, so that when the user faces the light emitting surface of the light guide structure, the light emitted from the light guide structure can be seen only in the case that the user's eyes are within the exit angle range. If the user's eyes are outside the exit angle range, the light emitted by the light guide structure cannot be seen. Therefore, when the technical solution provided by the present disclosure is applied to a display product, it can achieve 360° anti-peeping function of the display product, thereby further ensuring that the safety of the information displayed by the display product when the user uses the display product.

It should be noted that the various embodiments in this specification are described in a progressive manner, and the same or similar portions between the various embodiments can be referred to each other, and each embodiment focuses on the differences from other embodiments. In particular, for the method embodiment, since it is basically similar to the product embodiment, the description is relatively simple, and the relevant parts can be referred to a part of the description of the product embodiment.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", or the like used in the present disclosure means that the element or item appeared in front of the word encompasses the element or item and their equivalents listed after the word, and does exclude other elements or items. The word "connected", "connecting" or the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A backlight module, comprising: a backlight source and a light guide structure arranged on a light emitting surface of the backlight source,
    wherein the backlight source comprises a substrate and a plurality of light emitting units arranged on the substrate at; intervals; and
    the light guide structure comprises a first medium layer and a second medium layer, the first medium layer comprises a plurality of first medium structures corresponding to the plurality of light emitting units respectively, and an orthogonal projection of each light emitting unit on the substrate is located within an orthogonal projection of a corresponding first medium structure on the substrate; and the second medium layer comprises a plurality of second medium structures, the plurality of second medium structure and the plurality of first medium structure are arranged alternately, and a refractive index of each second medium structure is less than a refractive index of a corresponding first medium structure,
    wherein each first medium structure is made of a magnetic-induced refractive index adjustment material, each second medium structure is made of a blue filter material, and the backlight module further comprises an electromagnetic unit for forming a controllable magnetic field, and the controllable magnetic field is configured to control the refractive index of the first medium structure.

2. The backlight module of claim 1, wherein a side surface of each of the plurality of first medium structures comprises a first part and a second part that are connected, the second part is located on a surface of the first part away from the backlight source, a first slope angle formed between the first part and a plane where the substrate is located is less than a second slope angle formed between the second part and the plane where the substrate is located, and the first slope angle is equal to a light emitting angle of a corresponding light emitting unit; and
    an incident light having the light emitting angle is incident on an interface of the first medium structure and the second medium structure, the incident angle generated is greater than a critical angle of total reflection between the first medium structure and the second medium structure.

3. The backlight module of claim 1, wherein the magnetic-induced refractive index adjustment material comprises a transparent elastic carrier as well as a transparent magnetic material and a mesoporous silica that are distributed in the transparent elastic carrier.

4. The backlight module of claim 3, wherein the transparent magnetic material is selected from iron borate ($FeBO_3$), iron fluoride ($FeF_3$), $K_2CrCl_4$, europium selenide (EuSe), rare earth glass, and nano ferroferric oxide ($Fe_3O_4$); and the transparent elastic carrier is made of a material selected from polydimethylsiloxane, epoxy resin, polyurethane or silicone rubber.

5. The backlight module of claim 1, wherein the orthogonal projection of the first medium structure on the substrate is a regular hexagon.

6. The backlight module of claim 1, wherein the blue light filter material comprises an ultraviolet absorber, titanium dioxide and silica gel.

7. The backlight module of claim 1, wherein the electromagnetic unit comprises:
    a control circuit arranged on the substrate for providing a control signal; and
    a plurality of electromagnetic subunits connected to the control circuit, the plurality of electromagnetic subunits being located in the peripheries of the plurality of light emitting units respectively, and the plurality of electromagnetic subunits being configured to generate a corresponding magnetic field under the control of the control signal.

8. The backlight module of claim 7, wherein the plurality of electromagnetic subunits is arranged in an array on the substrate, and is located on the peripheries of the plurality of first medium structures respectively.

9. The backlight module of claim 1, wherein the substrate comprises a flexible circuit board or a printed circuit board, and each light emitting unit comprises a mini light-emitting diode.

10. The backlight module of claim 1, wherein an interval space is formed between adjacent first medium structures, the formed interval spaces correspond to the plurality of second medium structures, and the plurality of second medium structures fills in the interval space respectively.

11. A display device, comprising the backlight module of claim 1.

12. A method for preparing a backlight module, comprising:
preparing a plurality of light emitting units arranged on the substrate at intervals to form the backlight source in the backlight module;
preparing a light guide structure in the backlight module, the light guide structure comprising a first medium layer and a second medium layer, wherein the first medium layer comprises a plurality of first medium structures corresponding to the plurality of light emitting units respectively; and the second medium layer comprises a plurality of second medium structures, the plurality of second medium structures and the plurality of first medium structures are arranged alternately, and a refractive index of each second medium structure is less than a refractive index of each first medium structure; and
laminating the light guide structure on the light emitting surface of the plurality of light emitting units, wherein an orthogonal projection of each light emitting unit on the substrate is located within an orthogonal projection of a corresponding first medium structure on the substrate,
wherein the backlight module further comprises an electromagnetic unit, and the preparing the light guide structure comprises:
forming a mold for preparing the first medium structure;
preparing a mixed material of a transparent magnetic material, a mesoporous silica and a transparent elastic carrier, injecting the mixed material into the mold to form the first medium structure, and separating the first medium structure from the mold; and
filling the blue filter material into the space formed between adjacent first medium structures to form the second medium structure; and
the method further comprises preparing an electromagnetic unit on the substrate, wherein the electromagnetic unit is configured to form a controllable magnetic field, and the controllable magnetic field is configured to control the refractive index of the first medium structure.

13. The method of claim 12, wherein the mold comprises a plurality of accommodating spaces, wherein an inner wall of each accommodating space comprises a first part and a second part, and a slope angle of the first part is less than a slope angle of the second part.

14. A method for driving a backlight module, comprising:
emitting light by a light emitting unit in the backlight source in the backlight module; and
allowing the light to be incident into the first medium structure in a light guide structure in the backlight module, and forming an incident angle on an interface between the first medium structure and the second medium structure in the light guide structure, wherein the incident angle is greater than a critical angle of total reflection between the first medium structure and the second medium structure, so that the light directly leaves the light guide structure from the first medium structure,
wherein the first medium structure is made of a magnetic-induced refractive index adjustment material, the second medium structure is made of a blue light filter material, and the backlight module further comprises an electromagnetic unit, and the method further comprises:
forming a controllable magnetic field by the electromagnetic unit, wherein the controllable magnetic field controls a refractive index of the first medium structure, when the refractive index of the first medium structure is controlled to decrease, the light emitted by the light emitting unit is incident into the first medium structure, and an incident angle is formed on an interface between the first medium structure and the second medium structure, the incident angle is less than a critical angle of total reflection between the first medium structure and the second medium structure, such that the light is incident into the second medium structure, and leaves the light guide structure after being filtered by the second medium structure.

15. The method of claim 14, wherein the magnetic-induced refractive index adjustment material comprises a transparent elastic carrier as well as a transparent magnetic material and a mesoporous silica that are distributed in the transparent elastic carrier, the electromagnetic unit forms a controllable magnetic field, and the controlling the refractive index of the first medium structure by the controllable magnetic field comprises:
controlling the transparent magnetic material to gather or disperse in the transparent elastic carrier by the controllable magnetic field formed by the electromagnetic unit, so as to change the refractive index of the first medium structure.

16. The method of claim 15, wherein the electromagnetic unit comprises a control circuit and a plurality of electromagnetic subunits, and the controlling the transparent magnetic material to gather in the transparent elastic carrier by the controllable magnetic field comprises:
providing a same first control signal to the plurality of electromagnetic subunits by the control circuit; wherein under the control of the first control signal, a magnetic field generated by the plurality of electromagnetic subunits has a same polarity, and under the action of the same polarity magnetic field, the first medium structure controls the transparent magnetic material therein to gather toward a middle part of the first medium structure.

17. The method of claim 15, wherein the electromagnetic unit comprises a control circuit and a plurality of electromagnetic subunits, and the controlling the transparent magnetic material to disperse in the transparent elastic carrier by the controllable magnetic field comprises:
providing a same first control signal to the first part of the electromagnetic subunits in the plurality of electromagnetic subunits and providing a same second control signal to the second part of the electromagnetic subunits in the plurality of electromagnetic subunits by the control circuit, wherein the first part of the electromagnetic subunits and the second part of the electromagnetic subunits are arranged alternately; the first part of the electromagnetic subunits generates a magnetic field with a first polarity under the control of the first control signal, the second part of the electromagnetic subunits generates a magnetic field with a second polarity under the control of the second control signal, and the first polarity is opposite to the second polarity; the first medium structure controls the transparent magnetic material therein to disperse toward an edge of the first medium structure under the action of a magnetic field with an opposite polarity.

\* \* \* \* \*